United States Patent [15] 3,662,232
Stahr [45] May 9, 1972

[54] SEMICONDUCTOR DEVICES HAVING LOW MINORITY CARRIER LIFETIME AND PROCESS FOR PRODUCING SAME

[72] Inventor: Donald F. Stahr, Johnstown, Pa.
[73] Assignee: FMC Corporation, San Jose, Calif.

[22] Filed: Dec. 10, 1970
[21] Appl. No.: 96,801

[52] U.S. Cl. ....................317/234, 317/237, 148/187
[51] Int. Cl. ....................H01l 7/02, H01l 5/00
[58] Field of Search ....................317/234; 148/187, 188

[56] References Cited

UNITED STATES PATENTS

| | | | |
|---|---|---|---|
| 3,337,779 | 8/1967 | Bowman et al. | 317/234 |
| 3,340,108 | 9/1967 | Vickery | 148/33 |
| 3,342,651 | 9/1967 | Raithel | 148/188 |
| 3,440,113 | 4/1969 | Walley | 148/187 |
| 3,461,356 | 8/1969 | Yamashita et al. | 317/234 |
| 3,485,684 | 12/1969 | Mann et al. | 148/187 |
| 3,502,515 | 3/1970 | McMullen et al | 148/175 |

*Primary Examiner*—James D. Kallam
*Attorney*—F. W. Anderson, C. E. Tripp and R. S. Kelly

[57] ABSTRACT

Silicon diodes and silicon controlled rectifiers are provided with reduced minority carrier lifetimes without a significant increase in forward voltage drop or reverse leakage current by means of a gadolinium dopant which is diffused into the semiconductor wafers after first being applied on one face thereof by means of a conventional sputtering process. Gadolinium is sputtered onto the base side of the rectifiers from a foil of the pure metal in a vacuum. The wafers are then placed in a furnace at a temperature above 820° C where the diffusion process takes place.

11 Claims, 4 Drawing Figures

INVENTOR
DONALD F. STAHR

BY C. E. Tripp
R. S. Kelly
ATTORNEYS

SEMICONDUCTOR DEVICES HAVING LOW MINORITY CARRIER LIFETIME AND PROCESS FOR PRODUCING SAME

BACKGROUND OF THE INVENTION

1. Field of the Invention

The present invention pertains to a process for introducing an impurity into a semiconductor body in order to improve certain electrical characteristics thereof, and more particularly, it pertains to a process for diffusing an impurity element into a silicon rectifier to achieve a reduction in minority carrier life-time.

2. Description of the Prior Art

Semiconductor rectifying devices, such as silicon diodes or silicon controlled rectifiers, are frequently required to change from the low impedance state to the high impedance state in a minimum period of time as, for example, in a high speed switching system. Since the time necessary to accomplish this change in state is directly dependent upon the lifetime of the minority carriers in the PN junction regions of the semiconductor devices, there has been a search over the last decade for ways to reduce the lifetime of the minority carriers without also significantly affecting the useful electrical characteristics of the PN junction such as the low forward impedance and the high reverse impedance.

It has been known for some time that a reduction in minority carrier lifetime in a semiconductor device can be obtained by furnishing recombination centers in the semiconductor material. It has been found that recombination centers are formed in the PN junction or space charge regions of such devices by the introduction of gold or copper atoms into the devices, normally by a solid state diffusion process which is carried out at times and temperatures whereby the normal N-type and P-type impurity levels of the semiconductor material are unaffected.

A method for producing a semiconductor PN junction device with reduced minority carrier lifetime by the introduction of gold atoms into the space charge regions thereof is described in the U.S. Pat. to Ciccolella et al. No. 3,067,485 wherein gold is uniformly dispersed throughout a semiconductor PN junction wafer by a solid state diffusion process. Gold or gold containing material is first coated onto the exterior surface of a silicon semiconductor body, and the silicon is then heated to a temperature in the range of from approximately 800° centigrade to approximately 1,300° centigrade for a period of time sufficient to achieve substantially complete solid solubility of the gold in the silicon. It has been shown that the reverse recovery time of a silicon diode so treated will be significantly decreased. The Ciccolella et al. patent also describes the use of iron or copper as a substitute for gold for achieving a reduction in minority carrier lifetime although such elements have not been as successful as gold in that they require a greater control in the diffusion process and are generally less stable.

One of the biggest drawbacks of using gold, or copper, to achieve fast recovery times in semiconductor diodes or to achieve a quick turn-off time in a semiconductor controlled rectifier is the fact that the forward voltage drop and the reverse leakage current of the devices are increased. In the case of the SCR, the minimum gate current required for triggering also increases with the use of gold or copper doping. While these increases can be tolerated in certain switching applications, in other applications, particularly at higher than normal power levels, they are undesirable and represent a significant disadvantage in presently available solid state high speed switching devices.

SUMMARY OF THE INVENTION

With the present invention semiconductor PN junction devices are produced which have low minority carrier lifetime but which also maintain a low forward voltage drop and a low reverse leakage current. This is achieved by the introduction of gadolinium atoms into the space charge regions of the semiconductor device. It has surprisingly been found that gadolinium atoms in the space charge regions act as recombination centers to sweep out the minority carriers during the switching from forward to reverse biasing voltage, yet, the basic electrical characteristics of the PN junction device are not degraded such as they are when gold or copper is utilized in a similar manner.

Successful gadolinium doping has been carried out on both silicon diodes and silicon controlled rectifiers. The gadolinium is applied to the one face of the semiconductor wafers, preferably by a sputtering technique, and then it is diffused into the wafers, particularly the space charge region thereof, by a conventional diffusion process at a temperature of at least 820° centigrade.

In the case of a diffused silicon diode, gadolinium is sputtered under vacuum conditions onto the back of the base layer of the device, i.e., the layer containing the starting silicon material before the diffusion process which produced the PN junction. Immediately following this operation, the wafers are inserted into a furnace with a nitrogen atmosphere for a period of time sufficient to diffuse the gadolinium into the PN junction region of the device.

With the gadolinium doped PN junction devices of the present invention, high speed switching can be obtained without seriously degrading the electrical characteristics of the junction by unduly increasing the forward voltage drop or the reverse leakage current. Consequently, high speed switching operations can be obtained more conveniently at power levels considerably higher than those previously used.

DESCRIPTION OF THE PREFERRED EMBODIMENTS

While the present invention has been found to possess significant utility in the fabrication of diffused solid state rectifying devices, it can be utilized in the fabrication of any PN junction semiconductor device. The process of the present invention has been found to be particularly useful in the fabrication of both standard polarity and reverse polarity diffused silicon diodes, i.e., solid state silicon diodes formed by a diffusion of the majority carriers where the starting, or base, material may be either P-type silicon or N-type silicon. The process of the present invention has also been carried out in the fabrication of all diffused silicon rectifiers.

Figure 1:
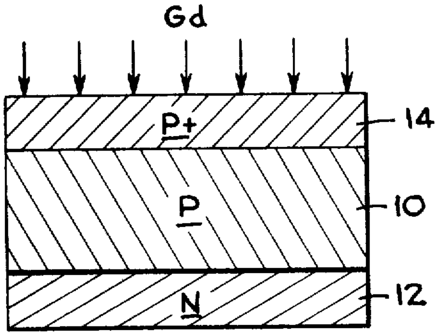
FIG. 1 is a cross-sectional view of a standard PN junction diode to which the process of the present invention is applied.

FIG. 1 illustrates a standard polarity silicon diode wafer which has been fabricated by a conventional diffusion process. In producing this diode, a wafer of P-type silicon, which has been chemically cleaned and lapped to a thickness in the order of 12 mils, is subjected first to a phosphorous diffusion and then to a boron diffusion to give the final N—P—P+ silicon structure. One method of carrying out such a double diffusion process is to first place the wafer of P-type silicon material in a furnace at approximately 1,250° C. for approximately 2 hours while passing $POCl_3$ over the wafer so as to form a layer 12 of N-type silicon about 2 mils thick upon the base layer 10 of P-type silicon. At the conclusion of this diffusion step one side of the wafer is lapped so as to reduce the total thickness of the wafer to about 8½ mils. The lapped side is then painted with boron trioxide ($B_2O_3$) while the remainder of the wafer is masked, and a second diffusion step is carried out to form a layer 14 of P+ material about 2 mils thick upon the base layer 10 to insure good ohmic contact with the P side of the diode.

The diode wafer thus formed is ready for the gadolinium diffusion step of the present invention which will be performed prior to the electroplating of the ohmic contacts to the end face of the wafer and the subsequent assembly of the completed diode structure.

Figure 2:
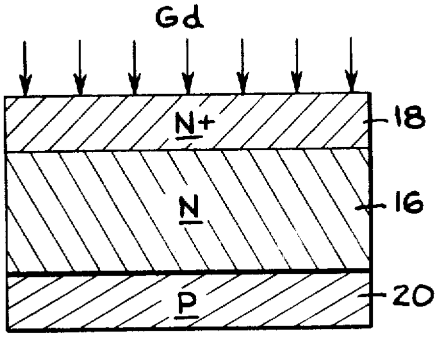
FIG. 2 is a cross-sectional view of a diode similar to FIG. 1 but illustrating one wherein the base or starting material is N-type silicon rather than P-type silicon.

The aforedescribed conventional diffusion process may also be used in essentially the same manner in fabricating the reverse polarity diode of FIG. 2. In this case, the starting material is an N-type silicon wafer whereby the base layer 16 thereof will be formed of N-type silicon material rather than P-type material. As with the diode of FIG. 1, a phosphorous diffusion is first carried out to provide an N+ layer 18 upon the base layer 16, and the N+ layer is then masked while a second, boron diffusion is carried out to provide a layer 20 of P-type material on the reverse side of the base and produce the final P—N—N+ silicon structure.

The diodes of FIGS. 1 and 2 are now ready for the gadolinium diffusion process of the present invention. The diffusion is a two step process wherein a thin layer of gadolinium is first sputtered onto one face of the wafer and then the wafer is heated in a furnace in a non-oxygen (nitrogen) atmosphere to allow the thin sputtered film of metal to diffuse into the crystalline structure of the diode. The apparatus for accomplishing this process is entirely conventional and is shown diagrammatically in FIG. 4.

The first step in the process as outlined hereinbefore is to apply a thin layer of gadolinium upon one face of the diode wafer, and in the case of the diffused diodes of FIGS. 1 and 2, the gadolinium will be applied to the base layer so that its diffusion into the silicon will not upset the impurity level in the diffused layer of the PN junction. That is to say, in the diode of FIG. 1 the gadolinium is deposited upon the P+ layer 14 (as shown) while in the diode of FIG. 2 the gadolinium is deposited upon the N+ layer 18 (as shown) so that the majority carrier levels in the N layer 12 (FIG. 1) and the P layer 20 (FIG. 2) will be unaffected. Thus, with the gadolinium diffusing through the more uniform base layers, there is less chance that the PN junction will be shorted by the secondary gadolinium diffusion. The application of the thin layer of gadolinium can be conveniently accomplished by means of a conventional glow discharge cathodic sputtering technique which is accomplished in an argon atmosphere under very low pressure conditions.

Figure 4:
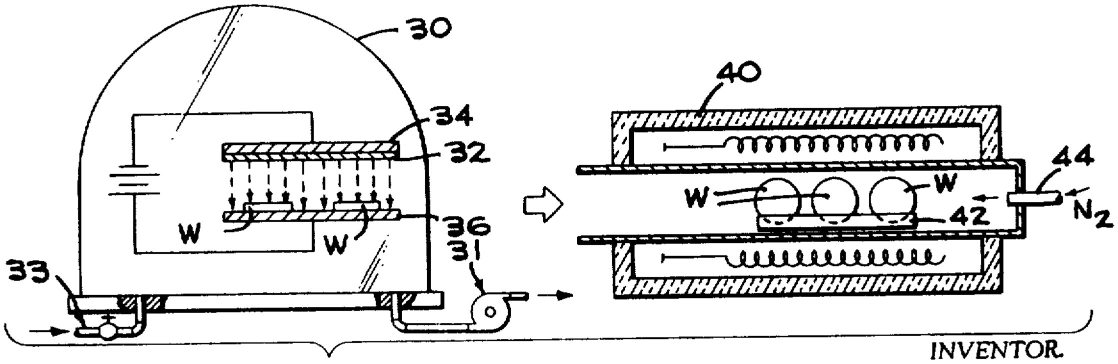
FIG. 4 is a diagrammatic illustration of the apparatus used in carrying out the process of the present invention.

The apparatus for accomplishing the sputtering of the gadolinium upon the diode wafers is shown at the left hand side of FIG. 4. A suitable closed chamber 30 is used to provide the controlled atmospheric conditions under which deposition of a metal by sputtering may be accomplished. A conventional evacuating means 31 is utilized to initially evacuate the chamber to achieve a high vacuum in the neighborhood of about 20 microns or better. The chamber is then backfilled with argon or other suitable inert gas from an inlet 33 until the pressure within the chamber has been raised to about 50 microns. A thin pure foil 32 of gadolinium is used as the target in the sputtering procedure and is attached directly to a cathode member 34 so that the gadolinium atoms which are removed therefrom under gas ion bombardment will be deposited directly upon the underlying substrate which, in the present case, consists of the wafers W. The wafers rest upon a substrate support structure or anode member 36. By placing the cathode 34 at a high DC potential, in the neighborhood of 2,000 volts, with respect to the anode member 36, and with the gadolinium foil being located about 3 inches above the wafers W, sputtering of the gadolinium atoms from the foil under the bombardment of the accelerated argon ions proceeds at a suitable rate without overheating the foil or the wafers. A sputtering time of from 2 to 20 minutes has been found to be sufficient (at a voltage of 2000 volts) to provide an ultra thin film of gadolinium of a few atoms in thickness which is enough gadolinium upon the face of the wafers in order to subsequently obtain a good diffusion of the metal into the wafers.

The diffusion step is carried out in a conventional semiconductor processing furnace 40 where the wafers W can be loaded onto a boat 42 and placed within the furnace at a temperature of at least 820° centigrade. In practice, a temperature of 900° C was found to produce good diffusion results. Nitrogen gas from outlet 44 is continuously passed over the wafers during the diffusion to exclude oxygen from the faces of the wafers, and the diffusion is continued for a period of time varying from 5 to 120 minutes depending upon the desired end results. In general, the longer the diffusion time the shorter will be the recovery time of the diode but at the expense of increased forward voltage drop and reverse leakage current. At the conclusion of the predetermined diffusion time, the wafers are pulled from the furnace and quenched in liquid nitrogen. The gadolinium diffused wafers are then processed in the normal manner to produce the final diode devices.

Figure 3:
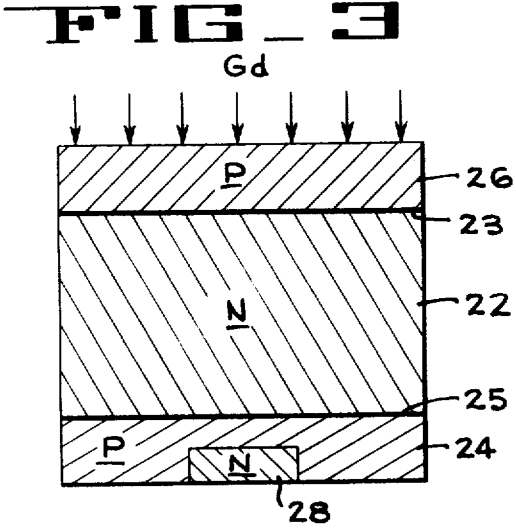
FIG. 3 is a cross-sectional view of a silicon controlled rectifier and illustrates the application of the process of the present invention thereto.

In FIG. 3, there is shown a conventional silicon controlled rectifier wafer to which the process of the present invention can also be applied. The manufacture of an all-diffused P-N-P-N wafer starts with the preparation of a large P-N-P wafer which is produced by simultaneously diffusing boron into both faces of a thin wafer of N-type silicon as, for example, by a conventional paint-on and heat treatment procedure using boron trioxide. This initial diffusion step produces a structure having a base layer 22 of N-type silicon of about 7½ mils in thickness and exterior layers 24 and 26 of P-type silicon of about 2½ mils each in thickness. The diode is then masked except for a small area in the face of one layer 24 of the P-type silicon, and a phosphorus diffusion is carried out to produce a small layer 28 of N-type silicon in the P layer 24 and thereby form the final P-N-P-N structure shown in FIG. 3. The gadolinium then may be diffused through the layer 26 of P-type material and the layer 22 of N-type material to provide gadolinium atoms in the regions of both the anode junction 23 and the control junction 25 to thereby reduce the minority carrier lifetime in the SCR.

The procedure for sputtering the gadolinium onto the outer layer 26 of the silicon controlled rectifier wafer shown in FIG. 3 is similar to that utilized with the PN junction diodes of FIGS. 1 and 2. The gadolinium is sputtered from the foil 32 of the pure metal from the cathode 34 to the anode 36 and the supported SCR wafers. The sputtering is conducted in an argon atmosphere at a pressure of 50 microns with an anode to cathode voltage of approximately 2000 volts and for a time of approximately 10 to 20 minutes. The wafers are then placed in a furnace 40 at a temperature in the neighborhood of 850° centigrade, and the metal is allowed to diffuse into the PN junctions of the SCR wafer. This diffusion step can be carried out for periods varying from three to nine minutes. As with the diodes, the wafers are then removed from the furnace, quenched in liquid nitrogen, and processed to complete SCR's in the normal fashion.

As a specific example of the process of the present invention, a series of gadolinium doped power diodes rated at 12 amperes forward current were prepared using the sputtering and diffusion techniques outlined hereinbefore. After the conventional boron and phosphorous diffusions to create the diffused PN junctions, the diode wafers were subjected to the sputtering of gadolinium on one face thereof with the sputtering being conducted at a voltage of 2,000 volts and a current of 75 milliamps for a period of 5 minutes after the sputtering chamber was first evacuated to 20 microns and then backfilled to 50 microns with argon. The diode wafers were next subjected to the diffusion of the gadolinium film therein at 900° C. for 90 minutes in a conventional semiconductor processing oven. The wafers were then plated and diced in the conventional manner to yield the 12 ampere rated power diodes which have a nominal diameter of 140 mils.

The recovery times of the power diodes were then measured by conventional test procedures wherein each diode was switched from a forward current conducting condition to a reverse voltage blocking condition and the recovery time, $t_{rr}$, was measured as the time during which reverse current flowed through the diode. The recovery times for the diodes were found to range from approximately 250 nanoseconds to approximately 450 nanoseconds with a mean value of approximately 330 nanoseconds. A standard forward voltage drop test and reverse voltage test were also performed upon each of the diodes. In the reverse voltage test, the voltage at which the reverse current reached 1 milliamp under room temperature conditions (25° C.) was recorded and the voltage at which the reverse current reached 2 milliamps under heated conditions (150° C.) was recorded with the reverse voltage rating being determined by the lower of the two recorded voltages. The forward voltage drop of the diodes was found to vary within a narrow range having a mean value of 0.98 volts. The reverse voltage rating was found to generally vary in the range of from approximately 1000 volts to approximately 1,200 volts under the test conditions aforedescribed.

The results of the secondary gadolinium doping of the particular power diodes described hereinbefore compare favorably with conventional gold doping of the same diodes. For example, conventional gold doping is provided by a two-step process including sputtering followed by diffusion at generally the same times and temperatures as in the aforedescribed gadolinium diffusion process. The recovery time for the gold doped diodes is generally in the same range as the gadolinium doped diodes as compared with a 600 to 900 nanosecond recovery time range for undoped diodes of the same type. However, such gold doped diodes have a mean forward voltage drop of approximately 1.15 volts as compared to a forward voltage drop of 0.95 volts in the undoped diodes. It can be seen therefore that the gadolinium doped diodes, with a mean forward voltage drop of 0.98 volts, are clearly preferable where loss of power is a factor. In the matter of the reverse voltage ratings, the undoped diodes tested exactly the same as the gadolinium doped diodes, i.e., with a reverse voltage rating in the range of from approximately 1,000 to approximately 1,200 volts. On the other hand, the gold doped diodes generally were rated in the range of from about 900 volts to about 1,000 volts reverse voltage and, therefore, are less desirable than the gadolinium doped diodes in this regard also.

As a second specific example of the use of the process of the present invention, a series of silicon controlled rectifiers were prepared by conventional double diffusion procedures as outlined hereinbefore and were then subjected to a secondary diffusion of gadolinium. The silicon controlled rectifiers that were prepared and tested after the normal plating and dicing of the wafers were high power devices having an average forward current rating of 150 amperes. Eight of such units were subjected to gadolinium sputtering for a time of 10 minutes at 2000 volts followed by a diffusion time of 5 minutes at 850° C. A group of thirteen additional units were subjected to a gadolinium sputtering time of 10 minutes at 2,000 volts followed by a 7 minute diffusion at 850° C. Another group of 10 units were sputtered with gadolinium for 10 minutes at 2000 volts followed by a 4 minute diffusion at 850° C. Another group of nine units was subjected to a 20 minute sputtering of gadolinium at 2,000 volts followed by a 7 minute diffusion at 850° C. while a still further group of 6 units was subjected to a 20 minute sputtering of gadolinium at 2,000 volts followed by a 4 minute diffusion at 850° C. In order to directly compare the results of the gadolinium doping with the prior art gold doping for the reduction of minority carrier lifetime, an additional group of 7 of such SCR units were prepared from wafers which were subjected to a ten minute sputtering of gold followed by a 4 minute diffusion at 850° C. The turn-off times for all of the various groups were then compared. As a matter of definition, the turn-off time, $t_{off}$, for each diode is defined as the shortest interval between the time when forward current reaches zero (after forward conduction) and the time when the SCR is able to block reapplied forward voltage without turning on. The turn-off times were measured in the conventional matter as set forth, for example, in the General Electric SCR Manual (4th Edition), 1967, published by the General Electric Company, Syracuse, New York. The tests were conducted with the SCR's at 125° C. with a forward anode current of 100 amps and a reverse anode current of 20 to 30 amps, $dv/dt$ = 100 volts/microsecond, and $di/dt$ = 5 amps/microsecond. The results of these tests, including the range and the average values for each group of SCR's tested, are given in the following table.

| | $t_{off}$, microsec. (range) | $t_{off}$, microsec. (average) | Forward Voltage Drop, volts (range) | Forward Voltage Drop, volts (average) |
|---|---|---|---|---|
| Au–10 min.sputter. 4 min. diff. | 145–210 | 173 | 1.44–1.55 | 1.46 |
| Gd–10 min.sputter. 4 min. diff. | 130–175 | 148 | 1.45–1.60 | 1.53 |
| Gd–10 min.sputter. 5 min. diff. | 40–130 | 61 | 1.60–1.70 | 1.63 |
| Gd–10 min.sputter. 7 min. diff. | 50 | 38 | 1.60–2.00 | 1.84 |
| Gd–20 min.sputter. 4 min. diff. | 50–180 | 120 | 1.35–1.60 | 1.49 |
| Gd–20 min.sputter. 7 min. diff. | 25–35 | 29 | 1.80–2.15 | 1.93 |

It can be seen from the foregoing table that the 4 minute gadolinium diffused wafers (after 20 minutes of sputtering) have a significantly lower turn-off time than the 4 minute gold diffused wafers, i.e., 120 microseconds as against 173 microseconds, while the forward voltage drop remains approximately the same, i.e., 1.49 volts as against 1.46 volts. As might be expected, the longer gadolinium sputtering time, wherein a greater amount of the metal was deposited, produced slightly greater minority carrier killing effects with the resultant lower turn-off times, e.g., 10 minute gadolinium sputtering vs. 20 minute gadolinium sputtering at the same diffusion times showed decreases in turn-off time from 48 to 120 microseconds (with a 4 minute diffusion) and from 38 to 29 microseconds (with a 7 minute diffusion). It can also be concluded that the greater the diffusion of gadolinium into the PN junction regions of the SCR's, the greater will be the reduction in turn-off time although at the expense of an increase in forward voltage drop. By comparing the gold doped SCR's with the gadolinium doped SCR' s at equal forward voltage drops, it is apparent that the gadolinium doped devices have a significantly greater reduction in turn-off time, and it is reasonable to conclude that gadolinium doped SCR's having the same turn-of time as gold doped SCR's will have a significantly lower forward voltage drop.

From the foregoing description, it will be apparent that the secondary diffusion of PN junction devices with gadolinium produces a reduction in minority carrier lifetime without also severely degrading the useful electrical parameters of the PN junction of low forward impedance and the high reverse impedance. Thus, high power rectifying semiconductor devices can be produced for high speed switching or similar applications without being inefficient due to significant power losses during forward conduction or without being limited by a significantly reduced reverse voltage rating.

Although the best mode contemplated for carrying out the present invention has been herein shown and described, it will be apparent that modification and variation may be made without departing from what is regarded to be the subject matter of the invention.

What is claimed is:

1. In a process for making a semiconductor including the steps of providing a semiconductor body and producing adjacent regions of opposite conductivity type respectively therein for forming a PN junction in said body, the improvement comprising the step of introducing gadolinium as a dopant into the space charge region of said PN junction for reducing the minority carrier lifetime therein.

2. In a process for making a semiconductor as set forth in claim 1 wherein said gadolinium is introduced by solid state diffusion through the base of said semiconductor device.

3. In a process for making a semiconductor as set forth in claim 2 including the step of sputtering the gadolinium onto one face of the semiconductor device prior to the diffusion of the gadolinium into the device.

4. In a process for making semiconductor as set forth in claim 1 wherein said semiconductor device is comprised of silicon.

5. In a process for making a silicon PN junction wafer including the steps of providing a silicon wafer and producing adjacent regions of opposite conductivity type respectively therein for forming a PN junction in said wafer, the improvement comprising the steps of applying a thin film of gadolinium to one face of the wafer, and heating the wafer for diffusing the gadolinium into the wafer and reducing the minority carrier lifetime in the space charge region of said PN junction.

6. In a process for making a silicon PN junction wafer according to claim 5 wherein said film of gadolinium is applied by a vacuum sputtering technique.

7. In a process for making a silicon PN junction wafer according to claim 6 wherein said diffusion process is carried out in a furnace at a temperature of at least 820° C.

8. In a process for making a silicon PN junction device according to claim 7 wherein said diffusion process is carried out for periods of from about 3 minutes to about 9 minutes.

9. A silicon rectifying device comprising a silicon body having at least one N-type region and at least one P-type region forming a PN junction in the body, the space charge region of said junction containing dopant inclusions of gadolinium for reducing the minority carrier lifetime therein.

10. A device according to claim 9 wherein said device comprises a silicon diode.

11. A device according to claim 9 wherein said device comprises a silicon controlled rectifier.

* * * * *